United States Patent

Grace et al.

(10) Patent No.: US 6,169,410 B1
(45) Date of Patent: Jan. 2, 2001

(54) WAFER PROBE WITH BUILT IN RF FREQUENCY CONVERSION MODULE

(75) Inventors: Martin I. Grace, San Jose; William W. Oldfield, Redwood City, both of CA (US)

(73) Assignee: Anritsu Company, Morgan Hill, CA (US)

( * ) Notice: Under 35 U.S.C. 154(b), the term of this patent shall be extended for 0 days.

(21) Appl. No.: 09/189,091

(22) Filed: Nov. 9, 1998

(51) Int. Cl.⁷ .......................... G01R 31/02; H01H 31/02
(52) U.S. Cl. .............................................. 324/754; 324/537
(58) Field of Search .................................. 324/754, 537, 324/755

(56) References Cited

U.S. PATENT DOCUMENTS

| | | | |
|---|---|---|---|
| 4,780,661 | * 10/1988 | Bolomey et al. | 324/638 |
| 4,873,484 | * 10/1989 | Adam | 324/115 |
| 4,983,910 | * 1/1991 | Majidi-Ahy et al. | 324/754 |
| 5,003,253 | * 3/1991 | Majidi-Ahy et al. | 324/754 |
| 5,032,784 | * 7/1991 | Smith | 324/121 R |
| 5,231,349 | * 7/1993 | Majidi-Ahy et al. | 324/754 |

* cited by examiner

*Primary Examiner*—Safet Metjahic
*Assistant Examiner*—Jermek M. Hollington
(74) *Attorney, Agent, or Firm*—Fliesler, Dubb, Meyer & Lovejoy, LLP

(57) ABSTRACT

A wafer probe with built in components to perform frequency multiplication, upconversion, downconversion, and mixing typically performed by an RF module of a vector network analyzer (VNA). The wafer probe is designed for testing integrated circuits used in collision avoidance radar systems and operates over the 76–77 GHz frequency range allocated by the Federal Communications Commission (FCC) for collision avoidance radars. To minimize costs, the wafer probe preferably utilizes integrated circuits for frequency multiplication, upconversion, downconversion, and mixing manufactured for collision avoidance radar systems.

4 Claims, 5 Drawing Sheets

WAFER PROBE WITH BUILT IN RF FREQUENCY CONVERSION MODULE

BACKGROUND OF THE INVENTION

1. Field of the Invention

The present invention relates to components for a vector network analyzer (VNA) and wafer probe which may be used to test integrated circuits manufactured for an automobile collision avoidance radar.

2. Description of the Related Art

Recently, automobile manufacturers, have provided collision avoidance radar systems in a limited number of vehicle models. Collision avoidance radar systems have also recently been made available for purchase by consumers for installation on trucks or automobiles. An example of such a system is the Eaton® VORAD® Collision Warning System available from Eaton VORAD Technologies, L.L.C., of San Diego, Calif.

Collision avoidance radar systems currently available operate by transmitting and receiving signals using an antenna located in the front grill area of a vehicle. The collision avoidance radar determines from a delay before a return signal is received, or from a frequency shift in a signal received, a distance an object causing the return signal is located from the vehicle and how fast the object is traveling relative to the vehicle.

Collision avoidance radar systems typically operate within a narrow frequency band. In the United States, the Federal Communications Commission (FCC) has allocated the frequency range of 76–77 GHz for collision avoidance radars.

A VNA is typically used with an attached wafer probe to test microwave integrated circuit components manufactured for a collision avoidance radar. A traditional VNA is an expensive system designed to operate over a wide range of frequencies. FIG. 1 shows a block diagram of typical components included in a VNA. As shown, the VNA includes signal sources 100–101, a test set 102, test modules 104–105, and a VNA controller 108.

A typical signal source which may be used for the LO signal source 100 and RF signal source 102 for a VNA is the Anritsu model 68037B, manufactured by Anritsu Company of Morgan Hill Calif. The 68037B signal source operates over a 2–20 GHz frequency range and provides power up to +17 dBm. The frequencies for the signal sources 100–101 are controlled by VNA controller 108 through signals over a general purpose interface bus (GPIB). An example of a VNA controller is the 37100A manufactured by Anritsu Company.

The LO signal from signal source 100 and the RF signal from signal source 101 are provided to a test set 102, such as the 3735A test set manufactured by Anritsu Company. Components included in the test set are shown in FIG. 2. The test includes a transfer switch 200 which selectively provides the RF drive signal from the RF signal source 101 to either the RF port 1 which connects to RF module 104, or to the RF port 2 which connects to the RF module 105. The transfer switch 200 is controlled by a signal received from the VNA controller 108. A power divider 202 provides the LO signal from the LO signal source 100 to the LO ports of the RF modules 104 and 105. The test set 102 further includes a power supply 204 and a printed circuit board (PCB) assembly 206. The power supply 204 converts a standard 115V AC signal to 12V and 15V DC signals. The PCB assembly 206, then provides further voltage regulation and distributes 12V and 15V signals to the RF modules 104 and 105 and forwards the transfer switch control signal to the transfer switch 200. The test set 102 further forwards the test IF and reference IF signals from the RF modules 104 and 105 to the VNA controller 108 as S-Parameter signals a1, a2, b1, and b2.

Components for RF modules 104 and 105 are shown in FIG. 3. An example of the RF module shown is the Anritsu 3741A-X millimeter wave module. The RF module of FIG. 3 contains multipliers 300 and 302 to enable a maximum 20 GHz output from the RF signal source 101 to be multiplied up to 80 GHz to provide coverage of the 76–77 GHz bandwidth for collision avoidance radar systems. Amplifier 304 serves to boost the input signal to the multiplier, while the output of multiplier 300 is amplified by amplifier 306. Amplifiers 304 and 306 receive power from the +12V output of the test set 102. Although the multipliers 300 and 302 are shown as times two (×2) devices, the multiplication factor is altered in test sets designed to cover frequency bands other than the 76–77 GHz bandwidth for collision avoidance radars.

An RF test signal is provided from multiplier 302 through dual directional coupler 308 to a test port as a test signal. The dual directional coupler 308 serves to provide both the test signal and a reference signal for analysis. The reference signal is provided from a first directional coupler in the dual coupler 308 which couples an incident signal provided from the RF signal source 101 through multipliers 300 and 302 and amplifiers 304 and 306 to a harmonic mixer 310. The test signal is received from a second coupler in dual coupler 308 which couples a transmitted or reflected signal from the test port to a harmonic mixer 312. The test signal results from reflections from a test device connected to the test port which will occur if an impedance mismatch exists. When a mismatch occurs, some of the test signal incident at the port will travel into the test device, and some will be reflected back to the test port. The transfer switch 200 of the test set 102 may provide the test signal through another RF module to measure parameters of a two port test device. With a test signal provided from a second RF module in a two port device, the portion of the signal that travels through the test device goes to the test port of the first RF module for measurement.

The harmonic mixers 310 and 312 mix the RF signals from the dual directional coupler 308 with the LO signal provided to the mixers through amplifier 313 and power divider 314 to downconvert the RF test and reference signals to 270 MHZ intermediate frequency (IF) signals TEST IF and REF IF. The amplifier 313 is a limiting amplifier used to keep the LO power at a fixed level into the harmonic mixers. The amplifier 320 provides the TEST IF signal from mixer 312, while the amplifier 322 provides the REF IF signal from the mixer 310. Amplifiers 313, 320, and 322 receive power from the +15V output of the test set 102. The TEST IF and REF IF signals are provided from the RF modules 104–105 to the VNA controller 108 via the test set 102. The TEST IF signal carries embedded magnitude and phase information relative to the REF IF signal.

An example of the VNA controller is the Anritsu 37100A. A typical VNA controller includes synchronous detectors, a digital signal processor or microprocessor, and a display. The synchronous detectors convert the TEST IF and REF IF signals to digital signal data. The VNA processor controlled by embedded firmware coupled with system software, manipulates this digital data. Resultant S-Parameter data characterizing the test device is then presented on the display, and can also be output to a printer or plotter, or routed to the rear panel external GPIB interface.

A wafer probe is an accessory which may be attached to test ports of a VNA enabling the VNA to be used to measure components for a wafer. Measurements on a wafer are performed before wafer circuits are separated or diced.

SUMMARY OF THE INVENTION

The present invention was developed with recognition that with a potential increase in demand for collision avoidance radar systems, it will be desirable to have a test system operating over a narrow bandwidth of the collision avoidance radar system to reduce test equipment cost.

The present invention was further developed with recognition that millimeter microwave integrated circuits (MMICs) used in collision avoidance radar systems are similar to components required in the RF module of a VNA, and the MMICs will operate over the narrow collision avoidance radar frequency range of 76–77 GHz. The present invention was further developed with recognition that the MMICs for collision avoidance radar systems multiply the signal source frequency so that a low cost low frequency signal source can be used to create a signal in the 76–77 GHZ range. The most complex and expensive parts of the VNA are in its signal sources and RF module, particularly for a VNA operating over a wide range of millimeter microwave frequencies. With increasing numbers of collision avoidance radar systems, the cost of MMICs used in the radar has been reduced, and is expected to be reduced further with increasing demand over time.

The present invention is a wafer probe with built in components to perform frequency multiplication, upconversion, downconversion and mixing typically performed by a RF module of a VNA. The wafer probe is designed for testing integrated circuits used in collision avoidance radar systems and operates over a slightly wider bandwidth than the 76–77 GHz frequency range allocated by the FCC for collision avoidance radars. By operating only near the 76–77 GHz collision avoidance radar frequency, the RF and LO signal sources can operate over a narrower frequency range than typical signal sources used with a VNA, and will be less expensive. Further minimizing costs, the wafer probe of the present invention preferably uses integrated circuits for frequency multiplication, upconversion, downconversion, and mixing manufactured for collision avoidance radar systems. Such integrated circuits will operate over the desired 76–77 GHz frequency range and will experience a reduction in cost as increased numbers of the collision avoidance radar systems are manufactured.

BRIEF DESCRIPTION OF THE DRAWINGS

Further details of the present invention are explained with the help of the attached drawings in FIG. 1 shows typical components included in a VNA.

DETAILED DESCRIPTION

Figure 4:
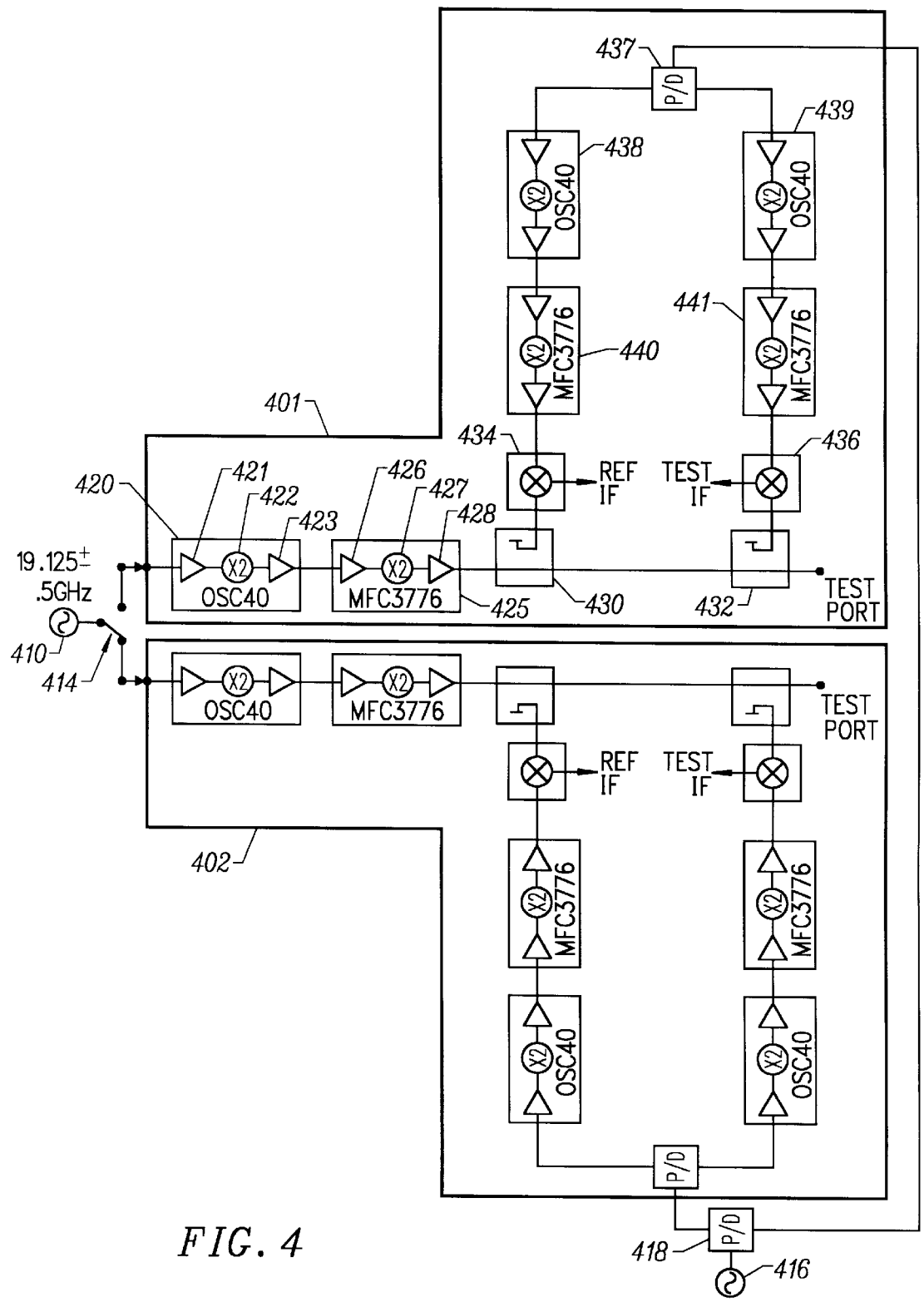
FIG. 4 shows components included in a wafer probe of the present invention.

FIG. 4 shows components built into one or more wafer probes of the present invention along with connections to components of a signal generator and test set provided separate from the wafer probes. The wafer probes of the present invention can each include built in components for one of the RF modules 401–402. The need for RF modules provided separate from wafer probes used with a VNA, such as RF modules 104 and 105 illustrated with respect to FIG. 1 is, thus, eliminated.

Figure 1:
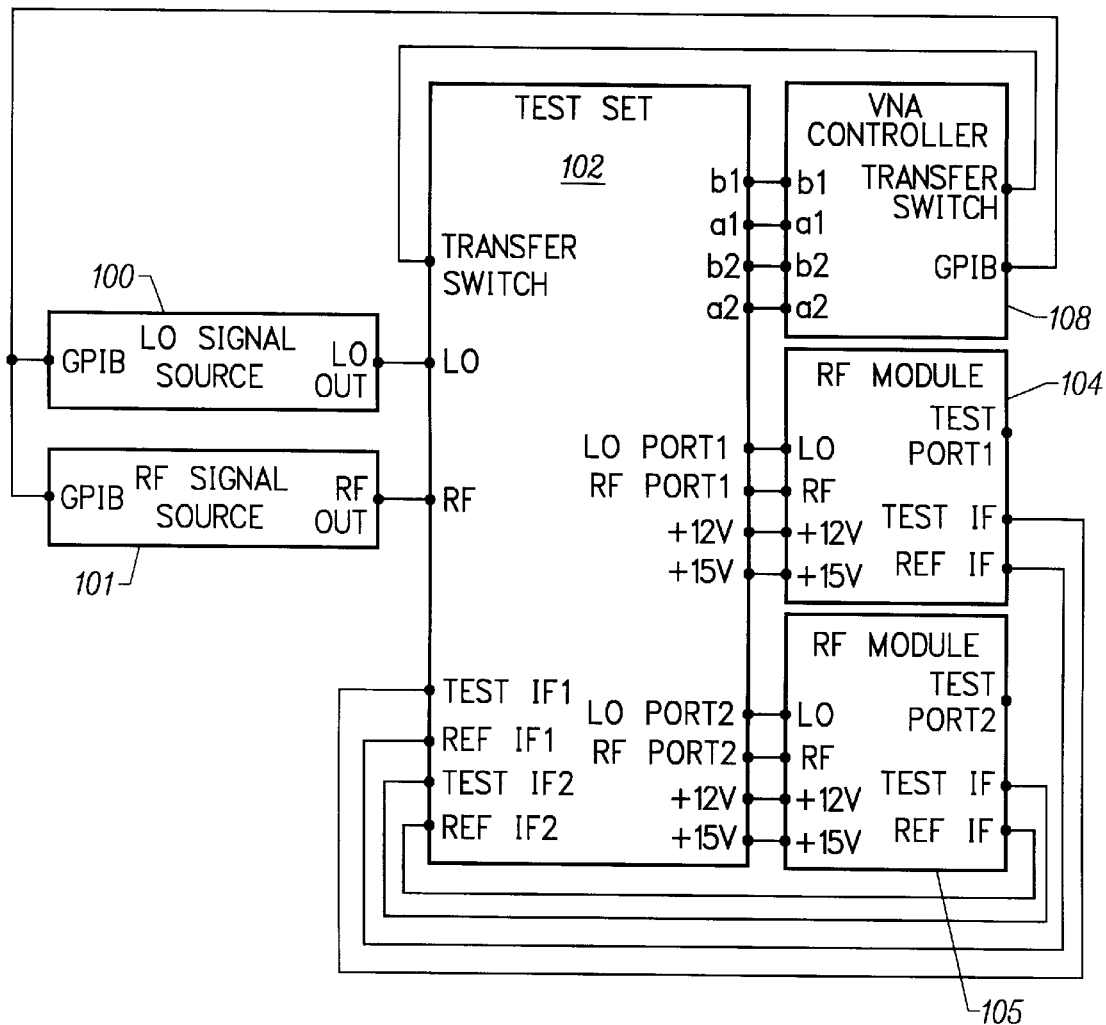
Figure 2:
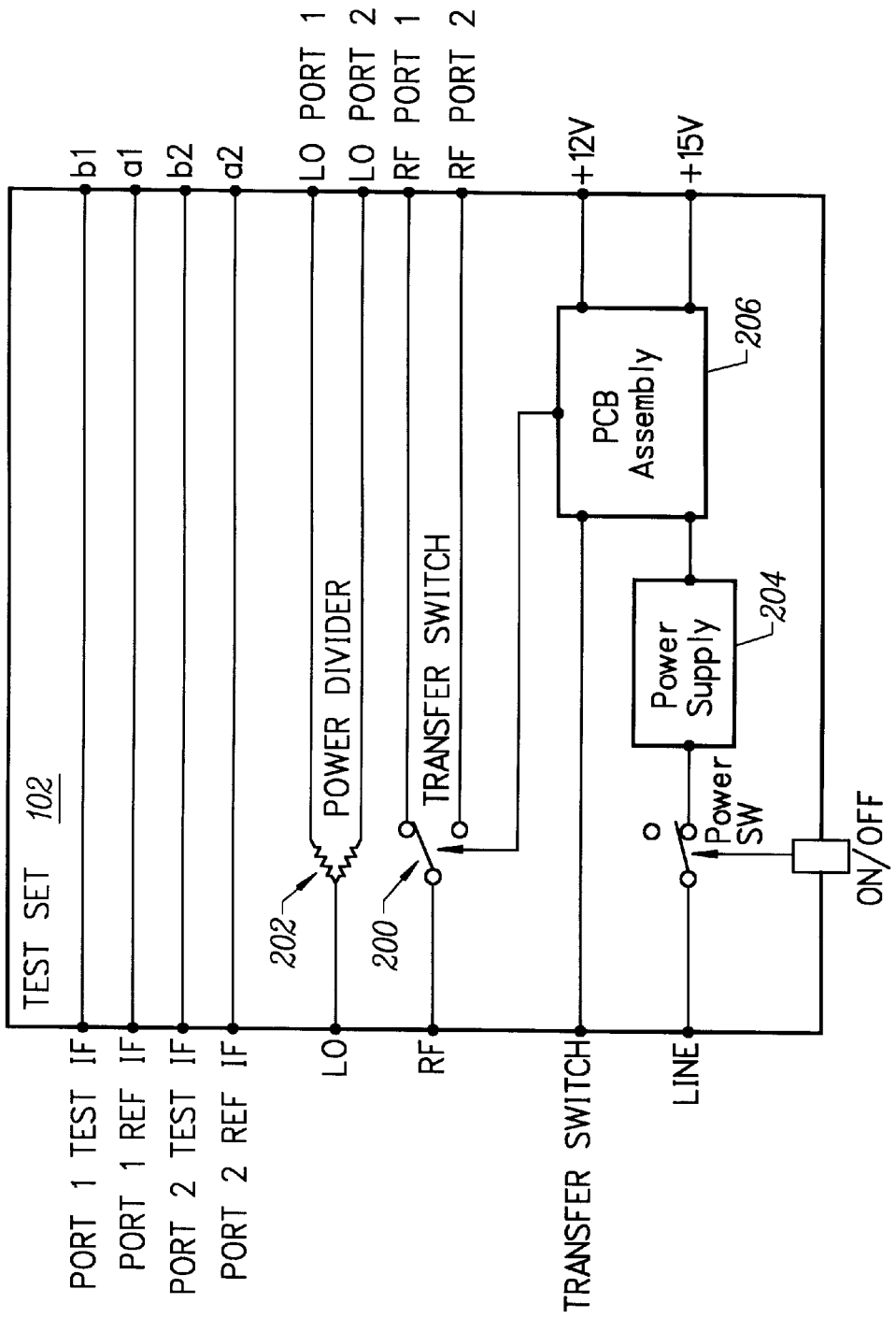
FIG. 2 shows components for the test set of FIG. 1.
Figure 3:
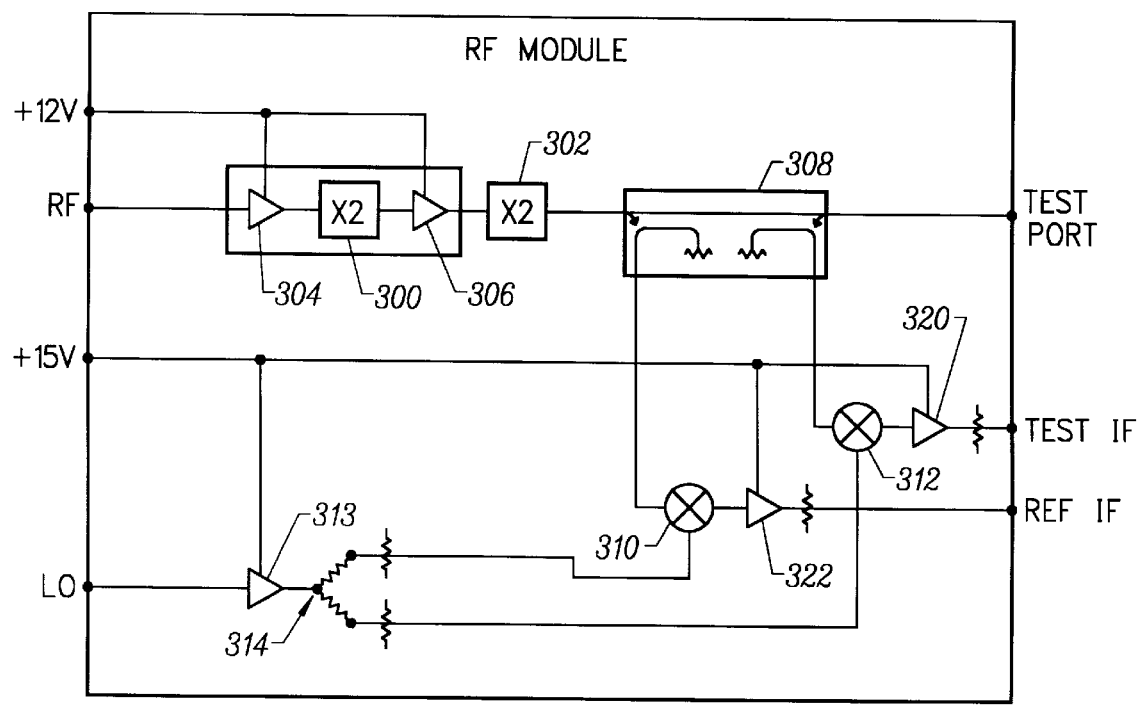
FIG. 3 shows components for the RF modules of FIG. 1.

The RF modules 401–402 receive an RF signal from a separate RF signal source 410, similar to the RF signal source 101 of FIG. 1. The RF signal source 410 is designed to operate over a 19.125±0.5 GHz range which will be multiplied up to a 74.5–78.5 GHz range in the RF modules 401–402 to enable testing throughout the 76–77 GHz collision avoidance radar bandwidth. With only a 19.125±0.5 GHz output signal required, a lower cost device can be used for the RF signal source 410 than a broadband device typically providing a 2–20 GHz, such as the Anritsu 68037B signal source as discussed previously. The output of the RF signal source 410 is provided to the RF modules 401–402 through a transfer switch 414 of a test set, similar to transfer switch 202 of FIG. 2.

The RF modules 401–402 further receive a LO signal from a separate LO signal source 416, similar to the LO signal source 100 of FIG. 1. The LO signal source 416 is designed to operate over a 19.125±0.5 GHz range which will be multiplied up to a 74.5–78.5 GHz range in the RF modules 401–402 for mixing with the RF signals with the signal frequency adjusted by a VNA controller to create an IF signal, such as the 270 MHz IF signal described earlier. With only a 19.125±0.5 GHz output signal required, a lower cost device can be used for the LO signal source 416 than a broadband 2–20 GHz device typically used. The output of the LO signal source 416 is provided to the RF modules 401–402 through a power divider 418 of a test set, similar to power divider 202 of FIG. 2.

The RF modules 401–402 include the same components, so a description of the components of the RF modules 401–402 will be made only with respect to RF module 401. In RF module 401, an RF signal from the transfer switch is received by a circuit 420 labeled OSC40. The OSC40 circuit 420 includes a frequency multiplier 422, and buffers 421 and 423 integrated onto a single circuit. The frequency multiplier 422 multiplies the 19.125±0.5 GHz signal by two to provide an output in the range of 38.25±1 GHz. An example of the OSC40 circuit which is commercially available is the CHV1040 Multifunction:K-band Oscillator and Q-band Multiplier manufactured by united monolithic semiconductors S.A.S.

The output signal from the OSC circuit 420 is provided to a circuit 425 labeled MFC3776. The MFC3776 circuit 425 includes a frequency multiplier 427, and buffers 426 and 428 integrated onto a single circuit. The frequency multiplier 427 multiplies the 38.25±1 GHz signal from the OSC40 circuit 420 by two to provide an output in the range of 76.5±2 GHz. An example of the MFC3776 circuit which is commercially available is the CHU2077 W-band Multifunction MultiplieriMPA manufactured by united monolithic semiconductors S.A.S.

The output of the MFC3776 circuit 425 is provided through couplers 430 and 432 to the test port which is connected to a wafer probe contact. The couplers 430 and 432 are formed on a substrate as a microstrip circuit using conventional chemical vapor deposition and etching procedures. The coupler 430 serves to couple the output signal from the MFC3776 circuit 425 as an incident reference signal to a mixer circuit 434. The coupler 432 serves to couple a signal received at the test port as a test signal to the mixer circuit 436.

To provide a LO signal to the mixer circuits 434 and 436, a power divider 437 provides the LO signal from power divider 418 to OSC40 circuits 438 and 439. The power divider 437 is formed on a substrate as a microstrip circuit using conventional chemical vapor deposition and etching techniques.

The OSC40 circuits 438–439 each include the same components as the OSC40 circuit 420 and serve to multiply the 19.25±0.5 LO signal by two to provide a 38.25±1 GHz output. The output of the OSC40 circuits 438 and 439 are provided to the inputs of respective MCF3776 circuits 440 and 441. The MCF3776 circuits 440–441 each include the same components as the MCF3776 circuit 425 and serve to multiply the 38.25±1 GHz signal by two to provide a 76.5±2 GHz output to the LO inputs of respective mixers 434 and 436.

The mixer 434 serves to mix the reference RF signal with the LO signal from the circuit 440 to provide a reference IF signal (REF IF). The REF IF signal can then be provided from a wafer probe to a test set, such as 102 of FIG. 1, and then from the test set to a VNA controller, such as 108 of FIG. 1. The mixer 436 serves to mix the test RF signal with the LO signal from the circuit 441 to provide a test IF signal (TEST IF). The TEST IF signal can also be provided from the wafer probe through a test set to a VNA controller. An example of an integrated circuit for either of the mixers 434 and 436 is the W-band Double Mixer manufactured by united monolithic semiconductors S.A.S.

As in FIG. 1, the VNA controller such as the Anritsu 3735A can be used to provide a signal over a GPIB to control the frequency of the RF signal source 410 and the LO signal source 416. The LO signal source frequency is offset from the RF signal source frequency to provide a test signal in the range of 270 MHz. Although not shown, the VNA controller can also provide signals over a GPIB to a PCB assembly of a test set, such as the PCB assembly 206 of FIG. 2, to control a voltage level provided to the amplifying buffers of the OSC40 and MCF3776 circuits to control amplifier gain.

Figure 5:
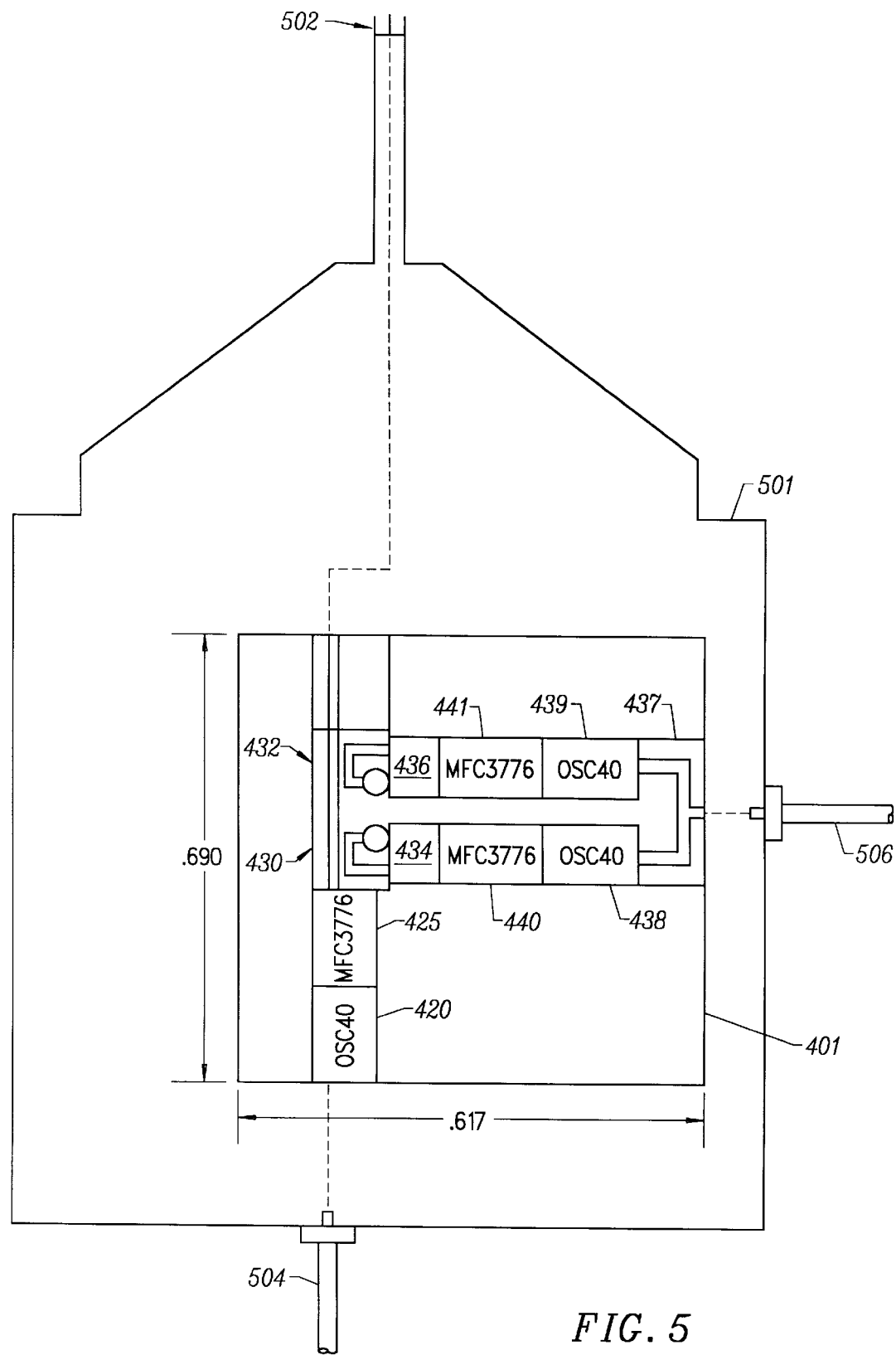
FIG. 5 shows a wafer probe with a layout for built in components of the RF module of FIG. 4.

FIG. 5 shows a layout of components of the RF module 401 of FIG. 4 built into a wafer probe. The wafer probe includes a housing 501. The housing supports a probe tip 502 which is contacted to circuits on a wafer to enable testing the wafer. The RF module 401 is placed on a substrate which is supported by the housing 501. With integrated circuit components used which are manufactured by united monolithic semiconductors S.A.S., as described above, the RF module 401 can occupy an area as small as of 0.617 in by 0.690 in., enabling the RF module 401 to be included on the wafer probe instead of on a device separate from the wafer probe. The test port of the RF module 401 as provided from coupler 432 provides a signal to the probe tip 502. A cable 504 connects the OSC40 circuit 420 to a test set to receive the output of a RF signal source. A cable 506 connects the power divider 437 to a test set to receive the output of a LO signal source. Additional cables or wiring (not shown) will be further connected to the RF module 401 to provide +12V and +15V DC signals to amplifiers.

Although the present invention has been described above with particularity, this was merely to teach one of ordinary skill in the art how to make and use the invention. Many other modifications will fall within the scope of the invention, as that scope is defined by the claims provided below. For example, with further development of collision avoidance radar systems, new components may be available to perform upconverting, downconverting, and mixing performed by the components shown in FIG. 4 making up RF module 401. For instance, components from the OSC40 and MFC3776 circuits may be combined onto a single chip. Further, the mixers 434 and 436 may be combined with frequency multipliers from the OSC40 and MFC3776 chips onto a single chip. Use of such chips, or only a portion of such chips, is believed within the scope of the present invention.

What is claimed is:

1. A wafer probe comprising:

a housing;

a wafer probe tip supported by the housing for making electrical contact with circuits on a wafer;

a first cable having a first end supported by the housing, the first cable further having a second end coupled to receive an RF signal from a first signal source;

a first frequency multiplier supported by the housing, the frequency multiplier having an input coupled to the first end of the first cable for receiving the RF signal, and having an output;

a first coupler supported by the housing, the first coupler having a first, a second and a third terminal, wherein the first coupler includes a through path connecting the first and second terminals, wherein the first terminal is coupled to the output of the first frequency multiplier, the first coupler further having a coupling path coupling the first terminal to the third terminal;

a second coupler supported by the housing, the second coupler having a first, a second and a third terminal, the second coupler having a through path connecting the first and second terminals of the second coupler, wherein the first terminal of the second coupler is coupled to the wafer probe tip, and the second terminal of the second coupler is coupled to the second terminal of the first coupler, the second coupler further having a coupling path coupling the first terminal of the second coupler to the third terminal of the second coupler;

a second cable having a first end supported by the housing, the second cable further having a second end coupled to receive a local oscillator (LO) signal from a second signal source;

a power divider having an input coupled to the first end of the second cable to receive the LO signal, and having a first output and a second output;

a second frequency multiplier supported by the housing, the second frequency multiplier having an input coupled to the first output of the power divider and having an output;

a third frequency multiplier supported by the housing, the third frequency multiplier having an input coupled to the second output of the power divider and having an output a first mixer supported by the housing, the first mixer having a first input, a second input and an output, wherein the first input is coupled to the third terminal of the first coupler, the second input is coupled to the output of the second frequency multiplier and the output provides a reference IF signal; and a second mixer supported by the housing, the second mixer having a first input, a second input and an output, wherein the first input of the second mixer is coupled to the third terminal of the second coupler, wherein the second input of the second mixer coupled to the output of the third frequency multiplier and wherein the output of the second mixer provides a test IF signal.

2. The wafer probe of claim 1 further comprising:

a fourth frequency multiplier coupling the output of the first frequency multiplier to the first terminal of the first coupler.

3. The wafer probe of claim 1 further comprising:

a fourth frequency multiplier coupling the output of the second frequency multiplier to the second input of the first mixer; and a fifth frequency multiplier coupling the output of the third frequency multiplier to the second input of the second mixer.

4. The wafer probe of claim 3 further comprising:

a sixth frequency multiplier coupling the output of the first frequency multiplier to the first terminal of the first coupler.

* * * * *